(12) United States Patent
Zhang et al.

(10) Patent No.: US 10,615,796 B2
(45) Date of Patent: Apr. 7, 2020

(54) LEVEL SHIFTER (71) Applicant: QUALCOMM Incorporated, San Diego, CA (US)

(72) Inventors: Zhiqing Zhang, San Jose, CA (US); Brett Walker, San Diego, CA (US); Chi Fan Yung, Singapore (SG); Justin Philpott, San Francisco, CA (US); Joseph Duncan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/658,910

(22) Filed: Jul. 25, 2017

(65) Prior Publication Data
US 2018/0034466 A1    Feb. 1, 2018

Related U.S. Application Data (60) Provisional application No. 62/368,784, filed on Jul. 29, 2016.

(51) Int. Cl.
*H03K 19/0185*    (2006.01)
*H03K 19/0175*    (2006.01)
(Continued)

(52) U.S. Cl.
CPC . *H03K 19/018521* (2013.01); *H03K 19/0013* (2013.01); *H03K 19/00361* (2013.01);
(Continued)

(58) Field of Classification Search
CPC ..... H03K 19/018521; H03K 19/00361; H03K 19/0013; H03K 19/018514;
(Continued)

(56) References Cited

U.S. PATENT DOCUMENTS 5,619,151  A   4/1997  Akioka et al.
7,129,752  B2  10/2006 Bayer
(Continued)

OTHER PUBLICATIONS

Partial International Search Report—PCT/US2017/043825 —ISA/EPO—dated Nov. 20, 2017.
(Continued)

*Primary Examiner* — Jung Kim
(74) *Attorney, Agent, or Firm* — Patterson & Sheridan, L.L.P.

(57) ABSTRACT

Certain aspects of the present disclosure provide methods and apparatus for level shifting an input signal ranging between certain voltage levels to generate an output signal ranging between other voltage levels with low power, high speed, and immunity to noise. One example level-shifting circuit generally includes a node for receiving an input signal ranging between a first voltage level and a second voltage level, a first circuit path coupled to the node and configured to level shift the input signal to generate an output signal ranging between a third voltage level and a fourth voltage level, a pulse generator coupled to the node and configured to generate a pulse based on a transition in the input signal between the first and second voltage levels, and a second circuit path connected in parallel with the first path and configured to temporarily short the first path based on the generated pulse.

30 Claims, 7 Drawing Sheets (51) Int. Cl.
*H03K 19/00* (2006.01)
*H03K 19/003* (2006.01)
*H04W 88/02* (2009.01)

(52) U.S. Cl.
CPC . *H03K 19/0175* (2013.01); *H03K 19/017509* (2013.01); *H03K 19/018514* (2013.01); *H04W 88/02* (2013.01)

(58) Field of Classification Search
CPC ...... H03K 19/0175; H03K 19/017509; H04W 88/02; G06F 3/00
See application file for complete search history.

(56) References Cited

U.S. PATENT DOCUMENTS

| | | | |
|---|---|---|---|
| 7,245,153 | B2 | 7/2007 | Murakami |
| 8,134,400 | B2 | 3/2012 | Yamamoto |
| 2007/0290735 | A1 | 12/2007 | Ali et al. |
| 2008/0048754 | A1* | 2/2008 | Woo .................. H03K 3/35613 327/333 |
| 2009/0115456 | A1 | 5/2009 | Chiang |
| 2013/0154713 | A1 | 6/2013 | Wang |
| 2013/0257505 | A1 | 10/2013 | Chiang |
| 2016/0036443 | A1 | 2/2016 | Li et al. |
| 2016/0079967 | A1 | 3/2016 | Miwa |
| 2016/0173070 | A1 | 6/2016 | Trivedi et al. |

OTHER PUBLICATIONS

International Search Report and Written Opinion—PCT/US2017/043825—ISA/EPO—dated Mar. 29, 2018.

\* cited by examiner

LEVEL SHIFTER

CLAIM OF PRIORITY UNDER 35 U.S.C. § 119

The present application claims the benefit of U.S. Provisional Application Ser. No. 62/368,784, entitled "LOW POWER, HIGH SPEED, AND NOISE IMMUNE LEVEL SHIFTER" and filed Jul. 29, 2016, which is assigned to the assignee of the present application and expressly incorporated by reference herein in its entirety.

TECHNICAL FIELD

Certain aspects of the present disclosure generally relate to electronic circuits and, more particularly, to a level shifter.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Amplifiers (e.g., transimpedance amplifiers, inverting amplifiers, etc.) may be used in a variety of systems to increase the power of an input signal, such as in wireless communication systems utilizing radio frequency (RF) signals. For example, amplifiers may be used in wireless communication systems to increase the power of an RF signal for transmission, or increase the power of a received RF signal. RF front ends in such systems may implement envelope tracking, in which the power supply voltage to the amplifier is adjusted to roughly track the envelope of a signal for transmission.

SUMMARY

Certain aspects of the present disclosure generally relate to a level-shifting circuit, such as a low power, high speed, and noise immune level-shifting circuit.

Certain aspects of the present disclosure provide a level-shifting circuit. The level-shifting circuit generally includes an input node for receiving an input signal ranging between a first voltage level and a second voltage level; a first circuit path coupled to the input node and configured to level shift the input signal to generate an output signal ranging between a third voltage level and a fourth voltage level; a pulse generator coupled to the input node and configured to generate a pulse based on a transition in the input signal between the first and second voltage levels; and a second circuit path connected in parallel with the first circuit path and configured to temporarily short the first circuit path based on the generated pulse.

Certain aspects of the present disclosure provide a method of level shifting an input signal ranging between a first voltage level and a second voltage level. The method generally includes receiving the input signal at a first circuit path, detecting a transition in the input signal, or in another signal based on the input signal, between the first and second voltage levels, generating a pulse based on the detected transition, temporarily turning on a second circuit path connected in parallel with the first circuit path based on the generated pulse, and level shifting the input signal using the first circuit path to generate an output signal ranging between a third voltage level and a fourth voltage level.

Certain aspects of the present disclosure provide a level-shifting circuit. The level-shifting circuit generally includes an input node, a first differential pair of transistors having gates coupled to the input node, a second differential pair of transistors having drains coupled to respective drains of the first differential pair of transistors, and a pulse generator having an input coupled to the input node and differential outputs coupled to respective gates of the second differential pair of transistors.

Certain aspects of the present disclosure provide an apparatus for level shifting an input signal ranging between a first voltage level and a second voltage level. The apparatus generally includes first means for level shifting the input signal to generate an output signal ranging between a third voltage level and a fourth voltage level; means for detecting a transition in the input signal, or in another signal based on the input signal, between the first and second voltage levels; means for generating a pulse based on the detected transition; and second means for level shifting the input signal during a width of the generated pulse, wherein the second means is faster at generating the output signal than the first means for level shifting.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure generally relate to level-shifting circuits having low power, high speed, and immunity to noise. Such level-shifting circuits may be utilized in switching power supplies, such as those used in envelope tracking amplification systems.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards.

An Example Wireless System

Figure 1:
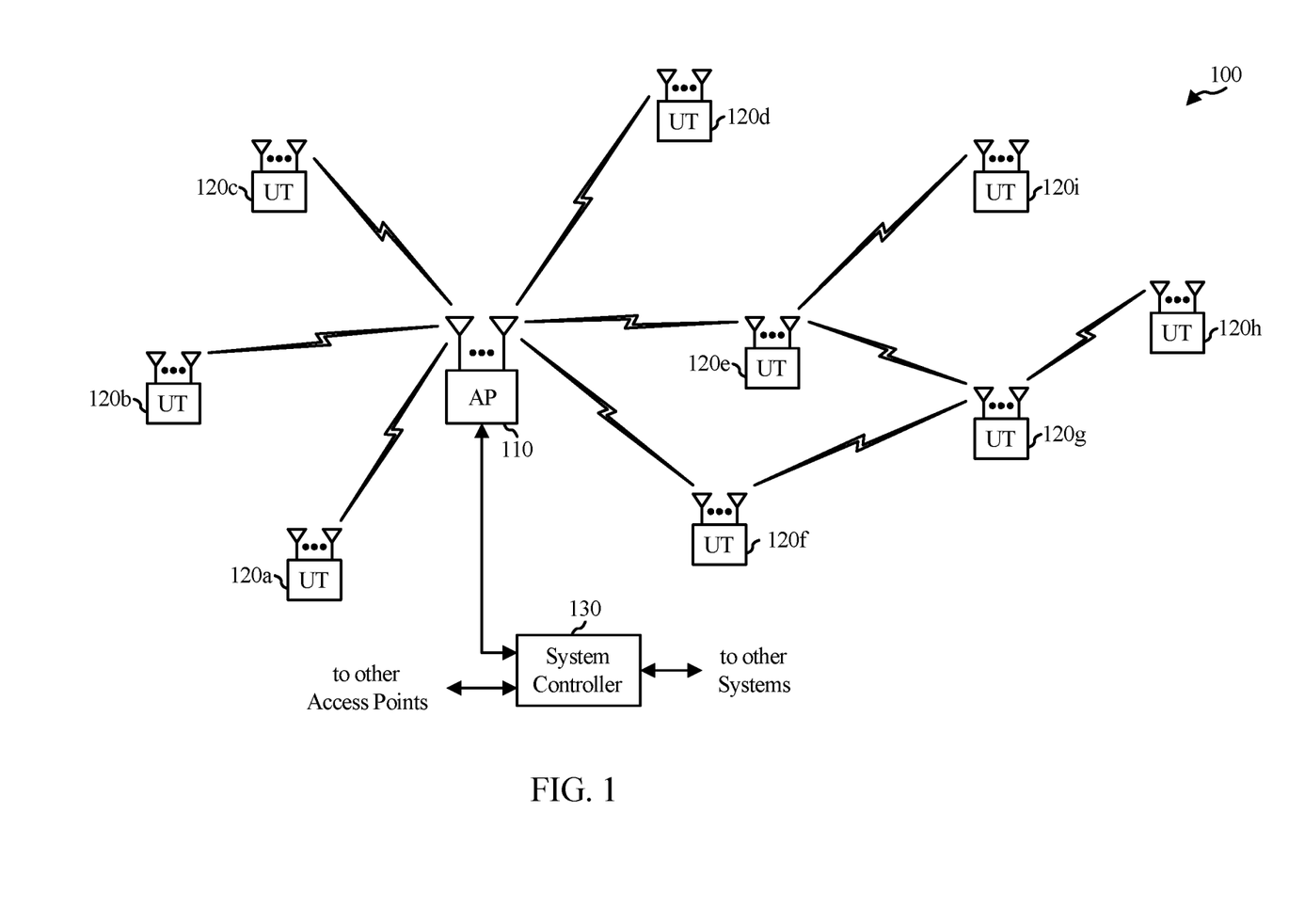
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more level shifters, such as in the switching power supply of an envelope tracking amplification system in the radio frequency front end (RFFE) of the access point or user terminal. At least one of the level shifters may be designed in accordance with certain aspects of the present disclosure.

Figure 2:
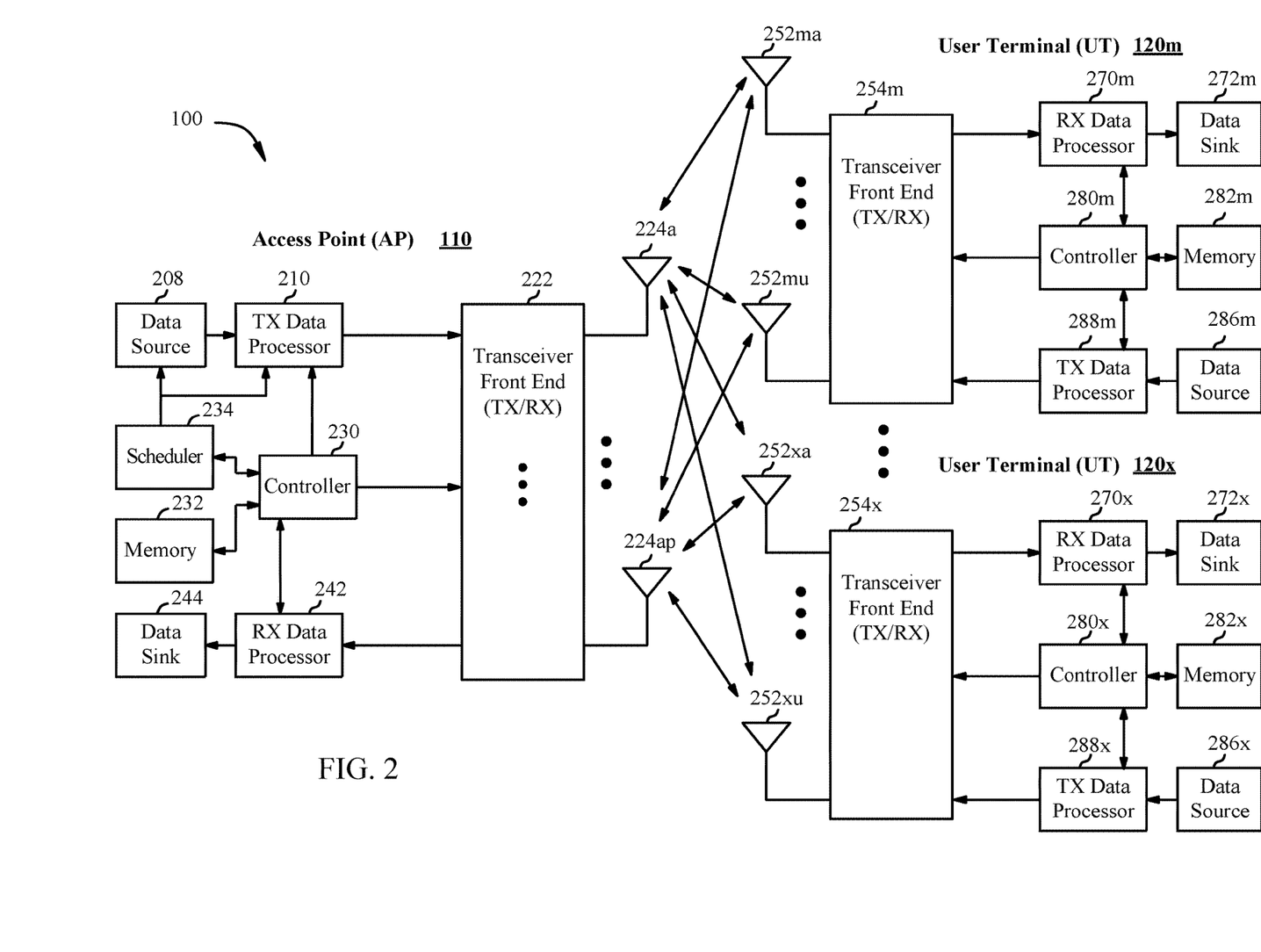
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. For certain aspects, the access point 110 is instead implemented as a base station, and/or one or more of the user terminals 120 are instead implemented as one or more mobile stations. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals may be selected for simultaneous transmission on the uplink, $N_{dn}$ user terminals may be selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point, base station, mobile station, and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver/front end (TX/RX) 254 (also known as a radio frequency front end (RFFE)) receives and processes (e.g., converts to analog, amplifies, filters, and frequency upconverts) a respective symbol stream to generate an uplink signal. The transceiver/front end 254 may also route the uplink signal to one of the $N_{ut,m}$ antennas for transmit diversity via an RF switch, for example. The controller 280 may control the routing within the transceiver/front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver/front end 222 may select signals received from one of the antennas 224 for processing. The signals received from multiple antennas 224 may be combined for enhanced receive diversity. The access point's transceiver/front end 222 also performs processing complementary to that performed by the user terminal's transceiver/front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

While FIG. 2 illustrates the transceiver/front ends 222, 254 each in a single box, those of skill in the art will appreciate that elements of the transceiver/front ends 222, 254 may be implemented across various elements, chips, modules, etc. For example, down and/or upconversion elements may be included in a transceiver chip within the transceiver/front end 222, 254, while a power amplifier and/or envelope tracking elements may be implemented in a module separate from the transceiver chip within the transceiver/front end 222, 254.

The transceiver/front end (TX/RX) 222 of access point 110 and/or the TX/RX 254 of user terminal 120 may include one or more level shifters, such as in the switching power supply of an envelope tracking amplification system in the TX/RX 222 or the TX/RX 254. At least one of the level shifters may be designed in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one or more of the $N_{dn}$ user terminals to be transmitted from one of the $N_{ap}$ antennas. The transceiver/front end 222 receives and processes (e.g., converts to analog, amplifies, filters, and frequency upconverts) the symbol stream to generate a downlink signal. The transceiver/front end 222 may also route the downlink signal to one or more of the $N_{ap}$ antennas 224 for transmit diversity via an RF switch, for example. The controller 230 may control the routing within the transceiver/front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver/front end 254 may select signals received from one of the antennas 252 for processing. The signals received from multiple antennas 252 may be combined for enhanced receive diversity. The user terminal's transceiver/front end 254 also performs processing complementary to that performed by the access point's transceiver/front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof, among other systems/schemes.

Figure 3:
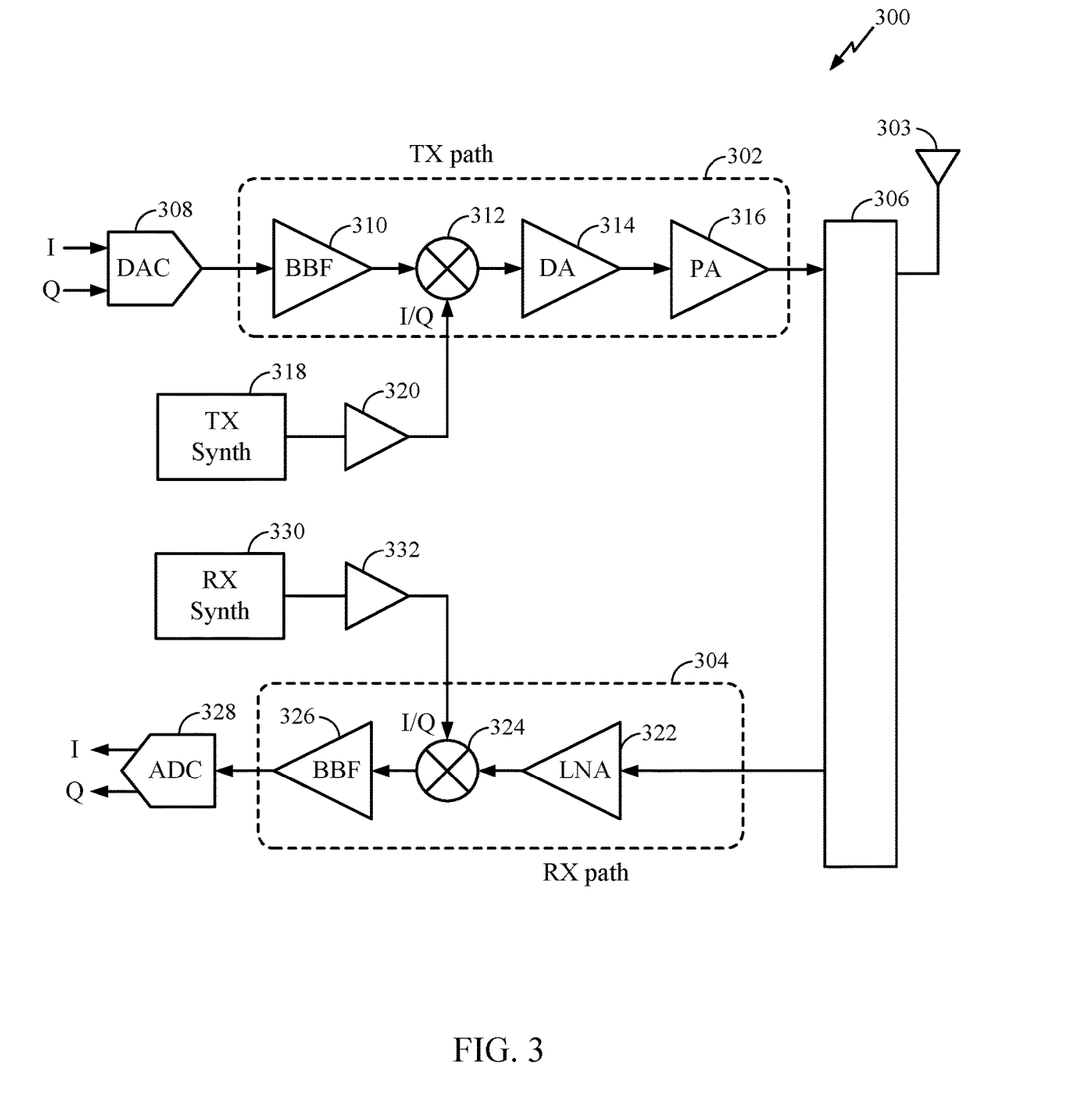
FIG. 3 is a block diagram of an example transceiver/front end, in accordance with certain aspects of the present disclosure.

FIG. 3 is a block diagram of an example transceiver/front end 300, such as transceiver/front ends 222, 254 in FIG. 2, in which aspects of the present disclosure may be practiced. The transceiver/front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) and/or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, whose output may be buffered or amplified by amplifier 320 before being mixed with the baseband signals in the mixer 312. Similarly, the receive LO may be produced by an RX frequency synthesizer 330, whose output may be buffered or amplified by amplifier 332 before being mixed with the RF signals in the mixer 324. The transceiver/front end 300 may, for example, be configured for operation in quadrature or polar.

In some aspects, the power supply for the PA 316 may comprise an envelope tracking power supply, in accordance with certain aspects of the present disclosure. The envelope tracking power supply may be configured to adjust the power supplied to the PA 316, where the voltage of the modulated power supply for the PA 316 substantially tracks (or is otherwise based on) the envelope (e.g., envelope waveform) of the signal to be amplified by the PA 316, for example, as described in more detail below.

Figure 4:
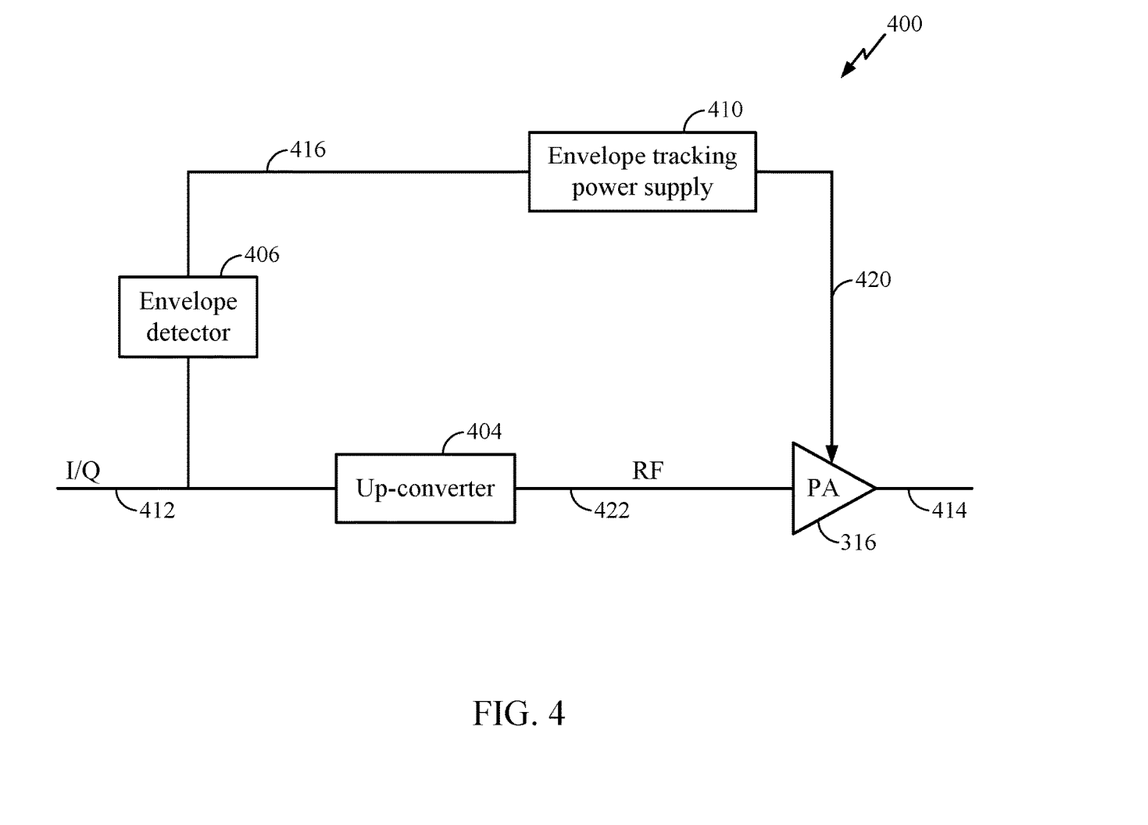
FIG. 4 is a block diagram of an example envelope tracking amplification system, in accordance with certain aspects of the present disclosure.

FIG. 4 illustrates an example envelope tracking amplification system 400, in which aspects of the present disclosure may be practiced. The envelope tracking amplification system 400 may include a PA 316, an up-converter 404, an envelope detector 406, and an envelope tracking power supply 410. As illustrated, the PA 316 may be configured to amplify an input signal 412 (or a signal based on the input signal). The input signal 412 may represent an in-phase (I) and/or quadrature (Q) signal, such as the output of the DAC 308 or of the BBF 310. In some cases, the input signal 412 may be upconverted to an RF input signal 422 by the up-converter 404 before being amplified by the PA 316. The up-converter 404 may include the mixer 312 in FIG. 3, for example.

The input signal 412 may also be used as an input to the envelope detector 406, which generates an envelope signal representing the envelope of the input signal 412 at an output 416 thereof (e.g., provides a signal representing the magnitude of the input signal 412). The output 416 of the envelope detector 406 provides an input to the envelope tracking power supply 410, which provides a supply voltage 420 to the PA 316 based on the output 416. In this manner, the supply voltage 420 of the PA is adjusted based on (e.g., substantially tracks) the envelope of the input signal 412. The PA 316 amplifies the input signal 412 or the RF input signal 422 to generate an amplified output signal 414 for transmission by an antenna, for example. The PA 316 may be implemented as a single stage or multi-stage amplifier.

An Example Level Shifter

A switching power supply (e.g., the envelope tracking power supply 410 of FIG. 4) may provide power via voltage rails having certain voltage levels to generate a desired power supply output voltage, but the control signals for the switching power supply may have different voltage levels. Therefore, level shifters may be used to shift the voltage levels of the control signals to appropriate voltage levels for driving the various switches in the switching power supply.

Figure 5:
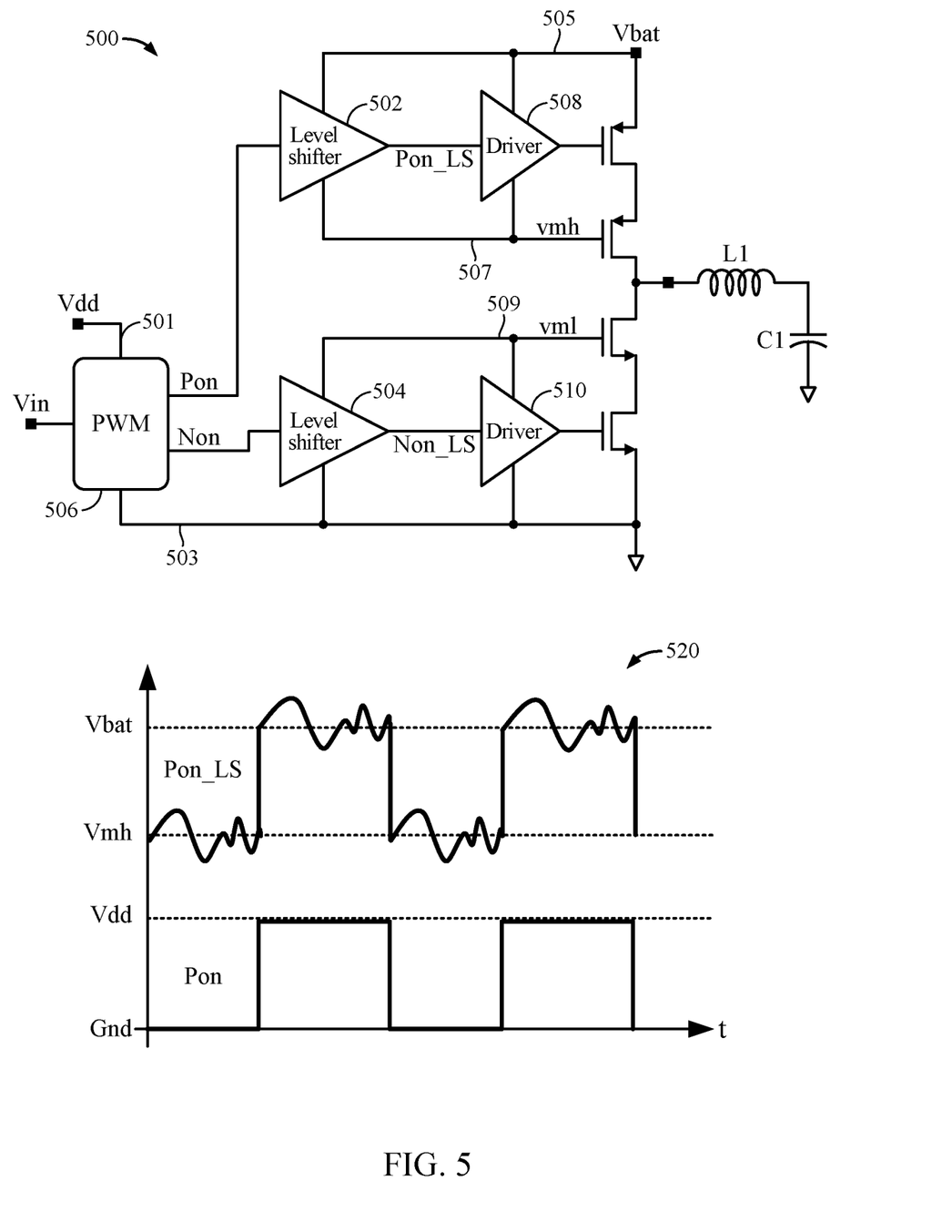
FIG. 5 is a block diagram of an example switching power supply using level shifters, in accordance with certain aspects of the present disclosure.

FIG. 5 is a block diagram of an example switching power supply 500 using level shifters 502, 504, in accordance with certain aspects of the present disclosure. The switching power supply 500 includes a pulse-width modulator (PWM) 506, such as a non-overlapping PWM. The PWM 506 may be powered by a voltage rail 501 with voltage Vdd (e.g., 1.8 V) and a voltage rail 503 at a reference potential (e.g., electrical ground). The PWM 506 receives an input signal (Vin) and generates differential PWM signals (labeled "Pon" and "Non") based on the input signal. For certain aspects, the input signal to the PWM 506 may represent an envelope signal (e.g., at the output 416 of the envelope detector 406 in FIG. 4). Pon and Non may range between Vdd and ground (Gnd), as illustrated in the waveform diagram 520 for Pon.

However, the transistors for implementing the switches of the power supply 500 may receive power from the reference voltage and a voltage rail 505 with voltage Vbat (e.g., a battery voltage of a user terminal 120). For certain aspects, Vbat may be greater than Vdd (e.g., 5.5 V versus 1.8 V). In order to sufficiently drive the transistors with drivers 508 and 510, level shifters 502 and 504 may be used to shift the voltage levels of the PWM signals Pon and Non to different voltage levels. For example, level shifter 502 may receive power from the voltage rail 505 having voltage Vbat and from a voltage rail 507 with bias voltage Vmh, such that the output signal (Pon_LS, standing for "level-shifted Pon") of the level shifter 502 ranges between Vbat and Vmh, as illustrated in the waveform diagram 520. For certain aspects, Vmh may have an electric potential between Vbat and Vdd. For other aspects, Vmh may be between Vdd and Gnd. Likewise, level shifter 504 may receive power from a voltage rail 509 with bias voltage Vml and the voltage rail 503 at the reference voltage for the power supply 500, such that the output signal (Non_LS, standing for "level-shifted Non") of the level shifter 504 ranges between Vml and Gnd. In some such aspects, a voltage input to the level shifter 504 which is not at Gnd (e.g., at Vdd) will be level shifted to Vml, while an input at Gnd will not be level shifted (e.g., will be output at Gnd). For certain aspects, Vml may have an electric potential between Vmh and Vdd. For other aspects, Vml may be between Vdd and Gnd.

For tightly controlled timing, it may be beneficial for the level shifters 502, 504 in the switching power supply 500 to be high speed, with low delay to avoid complexity in the control loop for the switching power supply. In addition, it may be beneficial for the level shifters 502, 504 to be noise resistant or immune because the various voltage rails 503, 505, 507, and 509 (e.g., Gnd, Vbat, Vmh, and Vml, respectively) in the switching power supply 500 may be noisy. This may reduce the likelihood of false switching. Many traditional level shifter designs, however, have had to trade off between speed and power consumption.

Certain aspects of the present disclosure are directed to speeding up the level shifting transition, while maintaining low power, allowing level shifters to have both low power and high-speed features. Such aspects may employ a fast circuit path and a pulse generator to detect a transition in the input signal and output a narrow pulse that momentarily turns on the fast circuit path to promote high-speed transitions in the level shifter's output signal. To prevent any false switching, a slow circuit path may be coupled in parallel with the fast circuit path in an effort to guarantee the level shifter is in the right state, regardless of any noise spikes (especially those caused by the fast transition and high transient current).

Figure 6:
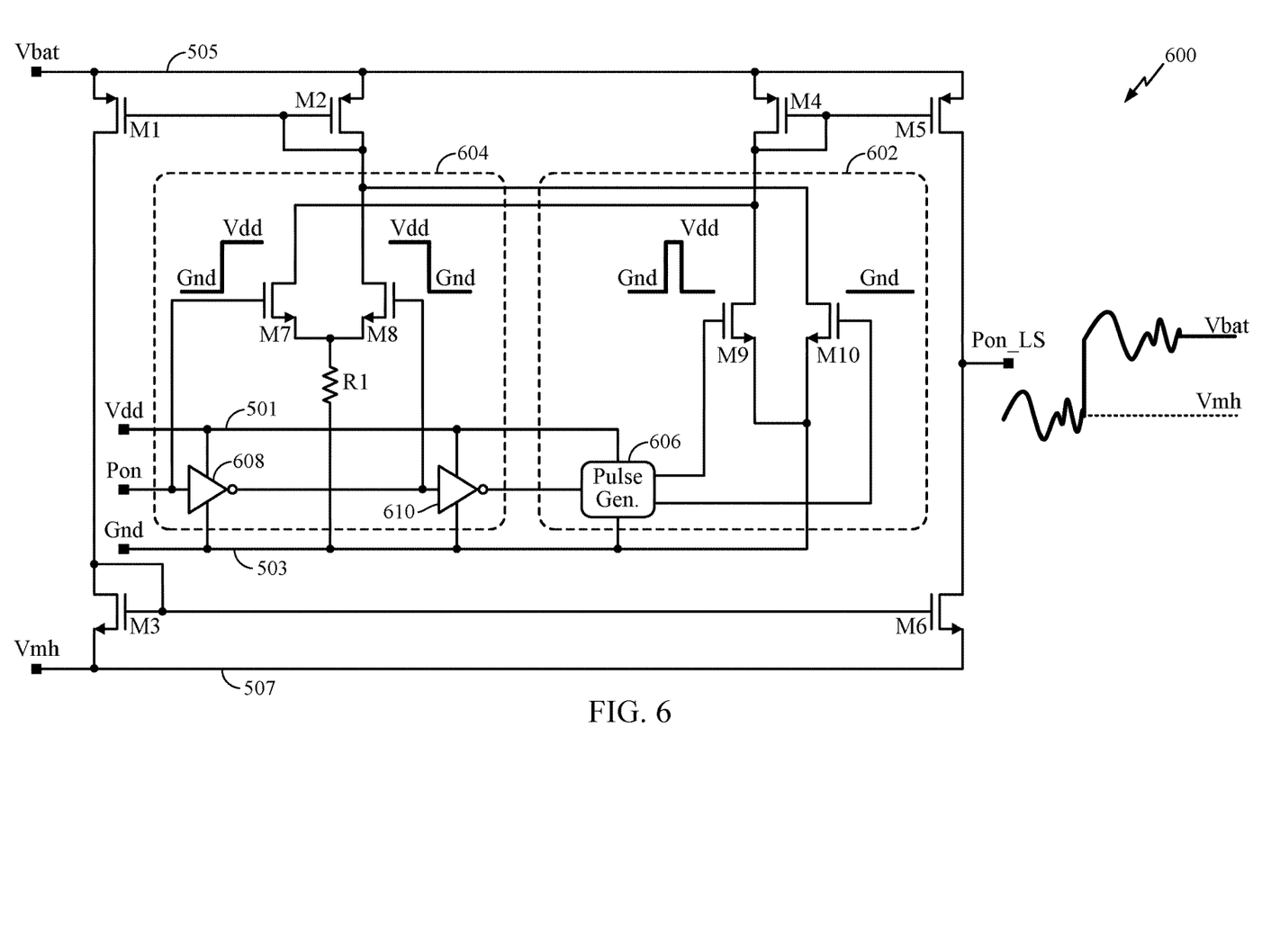
FIG. 6 is a schematic diagram of an example level shifter, in accordance with certain aspects of the present disclosure.

FIG. 6 is a schematic diagram of an example level shifter 600, in accordance with certain aspects of the present disclosure. The level shifter 600 includes a fast circuit path (also referred to as an AC path) 602 and a slow circuit path (also referred to as a DC path) 604. The DC path 604 may be coupled in parallel with the AC path 602, as illustrated. A pair of differential inputs are employed to leverage the benefits of both the DC path 604 and the AC path 602, where the DC path 604 includes a pair of differential transistors M7 and M8 (e.g., configured as a comparator) and the AC path 602 includes a pair of differential transistors M9 and M10. The drain of M7 is connected with the drain of M9, and the drain of M8 is connected with the drain of M10. The level shifter 600 also includes a pulse generator 606. The AC path 602 is momentarily on when the input signal Pon is changing polarity (e.g., the duration may be less than a few nanoseconds), which provides for quickly settling the output (Pon_LS) of the level shifter 600. The very short pulse width avoids drawing excessive power through the AC path 602 over time, due to the large transient current draw while the AC path is turned on. The transient current is relatively large because the AC differential transistors M9 and M10 may be fully turned on for speed and not current-limited.

The DC path 604 is configured to operate in conjunction with the AC path 602 to set the voltage level correctly. For example, the DC path 604 may be adapted to cause the output of the level shifter 600 to settle at the right voltage level with minimum or short pulse width of the AC path 602 to save power. The DC path 604 may include a current-limiting circuit to limit the current through the transistors M7 and M8 to save power, since the DC path 604 is on continuously. The current-limiting circuit may be implemented with a resistor R1 as shown, with a current source for sinking a bias current, or using other current-limiting means. The current-limiting circuit may be connected with the sources of the transistors M7 and M8. To facilitate high-speed settling, the AC path 602 may omit a current-limiting circuit to limit the current through the transistors M9 and M10, as described above. Instead, the sources of the transistors M9 and M10 may be connected directly with the voltage rail 503.

The level shifter 600 may include an inverter 608, which may receive power via the voltage rail 501 with Vdd and the voltage rail 503 with the reference voltage. The inverter 608 may receive the input signal Pon and generate an inverted signal Pon*. The gate of transistor M7 may receive the input signal Pon, while the gate of transistor M8 may receive the inverted signal Pon*, such that the gates of transistors M7 and M8 receive a differential input pair of signals (e.g., Pon and Pon* are 180° out of phase). The level shifter 600 may also include an inverter 610, which may also receive power via the voltage rails 501, 503. The inverter 610 may invert the inverted signal Pon* and generate an output signal (e.g., a delayed version of Pon), which is received by the pulse generator 606.

The drains of the transistors M8 and M10 may be connected with the drain of a transistor M2, which may be shorted to the gate of the transistor M2 and connected with the gate of a transistor M1. Similarly, the drains of the transistors M7 and M9 may be connected with the drain of a transistor M4, which may be shorted to the gate of the transistor M4 and connected with the gate of a transistor M5. The sources of the transistors M1, M2, M4, and M5 may be connected with the voltage rail 505 with voltage Vbat. The drain of the transistor M1 may be connected with the drain of a transistor M3, which may be shorted to the gate of the transistor M3. The drain of the transistor M5 may be connected with the drain of a transistor M6. The gate of the transistor M3 may be connected with the gate of the transistor M6, and the sources of the transistors M3 and M6 may be connected with the voltage rail 507 with voltage Vmh. M1, M2, M4, and M5 may be implemented with PMOS transistors, as shown in FIG. 6. M3, M6, M7, M8, M9, and M10 may be implemented with NMOS transistors, as illustrated.

In operation, the level shifter 600 may start with the input signal Pon in a first state with a logical low (e.g., Pon=Gnd) as illustrated. The inverter 608 may have inverted Pon such that Pon*=Vdd, as illustrated. The inverter 610 may have previously inverted Pon* such that the pulse generator 606 will not be subsequently triggered (e.g., the gates of the transistors M9 and M10 both receive pulse generator output signals with logical lows). Thus, both the transistors M9 and M10 are off in steady state. With Pon=Gnd and Pon*=Vdd, the transistor M7 will be off, such that the transistors M4 and M5 will also be off. The transistor M8 will be on, such that the transistors M2 and M1 will also be on. With the transistor M1 on, the transistor M3 will also be on to mirror the current through the transistors M2 and M8. With the transistor M3 on, the transistor M6 will be biased on, pulling the output signal Pon_LS down to the voltage rail 507 with voltage Vmh. In other words, Pon at Gnd has been effectively shifted to Pon_LS at Vmh.

When the input signal Pon transitions from the first state with a logical low to a second state with a logical high (e.g., Pon=Vdd) as depicted in FIG. 6, the inverter 608 inverts Pon such that Pon*=Gnd, and the inverter 610 inverts the Pon* signal and triggers the pulse generator 606 to output a short pulse to the gate of the transistor M9, with an amplitude of Vdd, for example. For other aspects, the short pulse outputted by the pulse generator 606 may have a different amplitude, such as an amplitude of Vbat (e.g., in the case where the pulse generator receives power from the voltage rail having electrical potential Vbat). This temporarily turns on the AC path 602 during the width of the pulse (e.g., a few ns) by turning on the transistor M9, which turns on the transistors M4 and M5, quickly pulling up the output signal Pon_LS to Vbat as illustrated. In the DC path 604, with Pon=Vdd and Pon*=Gnd, the transistor M8 will be turned off, such that the transistors M2 and M1 will also be turned off. The transistor M7 will be turned on, such that the transistors M4 and M5 will also be on (which may remain on from being turned on by the AC path 602 during the duration of the short pulse). In other words, Pon at Vdd has been effectively shifted to Pon_LS at Vbat.

When the input signal Pon transitions from the second state with a logical high to a third state with a logical low (e.g., Pon=Gnd), the inverter 608 inverts Pon such that Pon*=Vdd, and the inverter 610 inverts the Pon* signal and triggers the pulse generator 606 to output a short pulse to the gate of the transistor M10, with an amplitude of Vdd, for example (not shown in FIG. 6). This temporarily turns on the AC path 602 during the width of the pulse by turning on the transistor M10, which turns on the transistors M2 and M1 (and in turn, transistors M3 and M6), quickly pulling down the output signal Pon_LS to Vmh. In the DC path 604, with Pon=Gnd and Pon*=Vdd, the transistor M7 will be turned off, such that the transistors M4 and M5 will also be turned off. The transistor M8 will be turned on, such that the transistors M2 and M1 will also be on (which may remain on from being turned on by the AC path 602 during the duration of the short pulse). With the transistor M1 on, the transistor M3 will also be on to mirror the current through the transistors M2 and M8. With the transistor M3 on, the transistor M6 will be biased on, pulling the output signal Pon_LS down to the voltage rail 507 with voltage Vmh. In other words, after reaching steady state with the third state, the level shifter 600 has been effectively returned to the first state.

As illustrated, the level shifter 600 of FIG. 6 shifts the PWM signal Pon to generate the level-shifted signal Pon_LS. A level shifter similar to the level shifter 600 may be used to level shift the PWM signal Non to generate the level-shifted signal Non_LS. In this Non level shifter, for example, the input of the inverter 608 may be connected to Non, the voltage rail 505 connected to Vbat in FIG. 6 may be replaced with a voltage rail 509 connected to Vml, and the voltage rail 507 connected to Vmh may be replaced with a voltage rail 503 connected to Gnd, as illustrated for the level shifter 504 of FIG. 5.

Although the level shifters presented herein are implemented in a switching power supply as one example application, the architecture of these level shifters can be used in any of various suitable applications.

Figure 7:
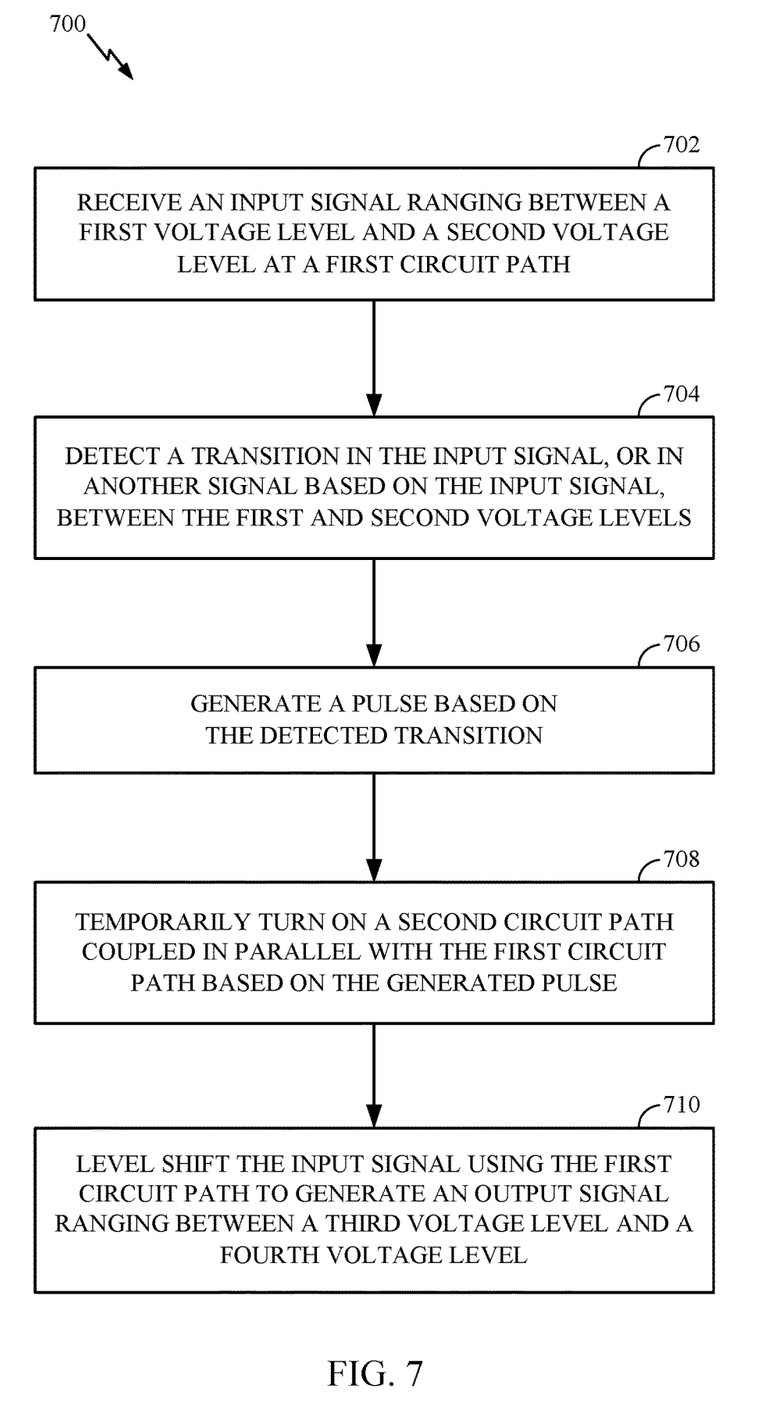
FIG. 7 is a flow diagram of example level shifting operations, in accordance with certain aspects of the present disclosure.

FIG. 7 is a flow diagram of example operations 700 for level shifting an input signal ranging between a first voltage level and a second voltage level, in accordance with certain aspects of the present disclosure. The operations 700 may be performed by a level-shifting circuit, such as the level shifter 600 of FIG. 6.

The operations 700 may begin, at block 702, with the level-shifting circuit receiving the input signal at a first circuit path. At block 704, the level-shifting circuit may detect a transition in the input signal, or in another signal based on the input signal, between the first and second voltage levels. The other signal based on the input signal may be an inverted version of the input signal, for example. At block 706, the level-shifting circuit may generate a pulse based on the detected transition.

At block 708, the level-shifting circuit may temporarily turn on a second circuit path coupled in parallel with the first circuit path based on the generated pulse. According to certain aspects, temporarily turning on the second circuit path at block 708 comprises temporarily shorting the first circuit path based on the generated pulse to reduce a settling time of the output signal compared to that of another level shifting circuit without the second circuit path. At block 710, the level-shifting circuit may level shift the input signal using the first circuit path to generate an output signal ranging between a third voltage level and a fourth voltage level.

According to certain aspects, the third voltage level is greater than the first voltage level. In some cases, the fourth voltage level is greater than the first voltage level, while in other cases, the first voltage level is greater than the fourth voltage level. For certain aspects, the third voltage level is greater than the fourth voltage level. For certain aspects, the first voltage level is greater than the second voltage level.

According to certain aspects, a pulse width of the pulse is on the order of a few nanoseconds.

Certain aspects of the present disclosure provide a level-shifting circuit. The level-shifting circuit generally includes an input node for receiving an input signal ranging between a first voltage level and a second voltage level; a first circuit path coupled to the input node and configured to level shift the input signal to generate an output signal ranging between a third voltage level and a fourth voltage level; a pulse generator coupled to the input node and configured to generate a pulse based on a transition in the input signal between the first and second voltage levels; and a second circuit path connected in parallel with the first circuit path and configured to temporarily short the first circuit path based on the generated pulse.

According to certain aspects, the second circuit path includes a first transistor having a gate coupled to an output of the pulse generator and configured to receive the generated pulse, a drain coupled to a first terminal of the first circuit path, and a source coupled to a second terminal of the first circuit path. For certain aspects, the first circuit path includes a current-limiting circuit coupled to the second terminal of the first circuit path and a second transistor having a gate coupled to the input node, a drain coupled to the first terminal of the first circuit path, and a source coupled to the current-limiting circuit. For certain aspects, the current-limiting circuit includes a resistor coupled between the second terminal of the first circuit path and the source of the second transistor. For other aspects, the current-limiting circuit includes a current sink coupled between the second terminal of the first circuit path and the source of the second transistor. For certain aspects, the second terminal of the first circuit path is coupled to a voltage rail having the second voltage level.

According to certain aspects, the level-shifting circuit further includes a first transistor, a second transistor, and a third transistor. In this case, a source of the first transistor and a source of the second transistor may be coupled to a first voltage rail having the third voltage level; a drain of the first transistor may be coupled to a gate of the first transistor, to a first terminal of the first circuit path, and to a gate of the second transistor; a drain of the second transistor may be coupled to an output node for outputting the output signal of the level-shifting circuit; the output node may be coupled to a drain of the third transistor; and a source of the third transistor may be coupled to a second voltage rail having the fourth voltage level.

According to certain aspects, the second circuit path is configured to temporarily short the first circuit path based on the generated pulse to reduce a settling time of the output signal compared to that of another level shifting circuit without the second circuit path.

According to certain aspects, the pulse generator is coupled to a first voltage rail having the first voltage level and to a second voltage rail having the second voltage level. In this case, the generated pulse may range between the first voltage level and the second voltage level. For other aspects, the pulse generator is coupled to a third voltage rail having the first voltage level and to a second voltage rail having the second voltage level. In this case, the generated pulse may range between the third voltage level and the second voltage level.

According to certain aspects, the second circuit path includes a first differential pair of transistors having gates coupled to a differential output of the pulse generator, wherein at least one of the gates is configured to receive the generated pulse, drains coupled to differential terminals of the first circuit path, and sources coupled to a terminal of the first circuit path. For certain aspects, the first circuit path includes a current-limiting circuit coupled to the terminal of the first circuit path and a second differential pair of transistors having gates coupled to the input node, drains coupled to the differential terminals of the first circuit path, and sources coupled to the current-limiting circuit. For certain aspects, the level-shifting circuit further includes a first inverter, wherein an input of the first inverter is coupled to the input node and to one of the gates of the second differential pair of transistors and wherein an output of the first inverter is coupled to the other one of the gates of the second differential pair of transistors. For certain aspects, the level-shifting circuit further includes a second inverter, wherein an input of the second inverter is coupled to the output of the first inverter and wherein an output of the second inverter is coupled to an input of the pulse generator. For certain aspects, at least one of the first inverter or the second inverter is coupled to a first voltage rail having the first voltage level and to a second voltage rail having the second voltage level; and the output of the first inverter and the input of the pulse generator ranges between the first voltage level and the second voltage level. For certain aspects, the current-limiting circuit includes a resistor coupled between the terminal of the first circuit path and the sources of the second differential pair of transistors. For other aspects, the current-limiting circuit includes a current sink coupled between the terminal of the first circuit path and the sources of the second differential pair of transistors. For certain aspects, the terminal of the first circuit path is coupled to a voltage rail having the second voltage level.

According to certain aspects, the level-shifting circuit further includes a first pair of transistors, a second pair of transistors, and a third pair of transistors, wherein: sources of the first pair of transistors and sources of the second pair of transistors are coupled to a first voltage rail having the third voltage level; drains of the first pair of transistors are coupled to respective gates of the first pair of transistors, to respective differential terminals of the first circuit path, and to respective gates of the second pair of transistors; drains of the second pair of transistors are coupled to respective drains of the third pair of transistors; a drain of one of the second pair of transistors and a drain of one of the third pair of transistors are coupled to an output node for outputting the output signal of the level-shifting circuit; gates of the third pair of transistors are coupled together and to a drain of another one of the third pair of transistors; and sources of the third pair of transistors are coupled to a second voltage rail having the fourth voltage level.

According to certain aspects, the third voltage level (e.g., Vbat) is greater than the first voltage level (e.g., Vdd), and the fourth voltage level (e.g., Vmh) is greater than the first voltage level. For certain aspects, the third voltage level is greater than the fourth voltage level, and the first voltage level is greater than the second voltage level (e.g., Gnd). For other aspects, the first voltage level (e.g., Vdd) is greater than the fourth voltage level (e.g., Gnd). In such cases, the fourth voltage level may be the same as the second voltage level (e.g., Gnd). For certain aspects, the third voltage level (e.g., Vml) is greater than the first voltage level, whereas in other aspects, the third voltage level is lower than the first voltage level. For certain aspects, the third voltage level is greater than the fourth voltage level, and the first voltage level is greater than the second voltage level.

Certain aspects of the present disclosure provide a level-shifting circuit. The level-shifting circuit generally includes an input node, a first differential pair of transistors having gates coupled to the input node, a second differential pair of transistors having drains coupled to respective drains of the first differential pair of transistors, and a pulse generator having an input coupled to the input node and differential outputs coupled to respective gates of the second differential pair of transistors.

According to certain aspects, sources of the second differential pair of transistors are connected to a voltage rail with a reference potential.

According to certain aspects, the level-shifting circuit further includes a current-limiting circuit coupled between sources of the first differential pair of transistors and a voltage rail with a reference potential.

According to certain aspects, the level-shifting circuit further includes an output node, a first transistor having a drain coupled to a drain of a first one of the first differential pair of transistors and to a drain of a first one of the second differential pair of transistors, and a second transistor having a drain coupled to the output node and a gate coupled to a gate of the first transistor and the drain of the first transistor. For certain aspects, the level-shifting circuit further includes a third transistor having a drain coupled to a drain of a second one of the first differential pair of transistors and to a drain of a second one of the second differential pair of transistors; a fourth transistor having a gate coupled to a gate and to the drain of the third transistor; a fifth transistor having a drain coupled to the drain of the fourth transistor and to a gate of the fifth transistor; and a sixth transistor having a drain coupled to the output node and a gate coupled to the gate of the fifth transistor. For certain aspects, the level-shifting circuit further includes a first voltage rail having a first voltage and coupled to sources of the first transistor, the second transistor, the third transistor, and the fourth transistor; and a second voltage rail having a second voltage and coupled to sources of the fifth transistor and the sixth transistor, wherein the first voltage is greater than the second voltage. For certain aspects, the level-shifting circuit further includes: (1) a first inverter having an input coupled to the input node and to a gate of a first one of the first differential pair of transistors and having an output coupled to a gate of a second one of the first differential pair of transistors; and (2) a second inverter having an input coupled to the output of the first inverter and having an output coupled to the input of the pulse generator.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver/front end 254 of the user terminal 120 depicted in FIG. 2, the transceiver/front end 222 of the access point 110 shown in FIG. 2, or the transceiver/front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver/front end 300 depicted in FIG. 3). Means for receiving may comprise a receiver (e.g., the transceiver/front end 254 of the user terminal 120 depicted in FIG. 2, the transceiver/front end 222 of the access point 110 shown in FIG. 2, or the transceiver/front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver/front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). First means for level shifting an input signal may comprise a portion of a level-shifting circuit with a relatively slow path (e.g., the DC path 604 including the transistors M7 and M8 and the current-limiting circuit depicted in FIG. 6). Means for detecting a transition and/or means for generating a pulse based on the detected transition may comprise a pulse generator (e.g., the pulse generator 606 portrayed in FIG. 6). Second means for level shifting may comprise a portion of a level-shifting circuit with a relatively fast path (e.g., the AC path 602 including the transistors M9 and M10 with no current-limiting circuit illustrated in FIG. 6).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface (in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A level-shifting circuit comprising:
an input node for receiving an input signal ranging between a first voltage level and a second voltage level;

a first circuit path coupled to the input node and configured to level shift the input signal to generate an output signal ranging between a third voltage level and a fourth voltage level;

a pulse generator coupled to the input node and configured to generate a pulse based on each transition in the input signal from the first voltage level to the second voltage level, the pulse generator being further configured to generate a pulse based on each transition in the input signal from the second voltage level to the first voltage level; and a second circuit path connected in parallel with the first circuit path and configured to temporarily short the first circuit path based on the generated pulse.

2. The level-shifting circuit of claim 1, wherein the second circuit path comprises a first transistor having:

a gate coupled to an output of the pulse generator and configured to receive the generated pulse;

a drain coupled to a first terminal of the first circuit path; and a source coupled to a second terminal of the first circuit path.

3. The level-shifting circuit of claim 2, wherein the first circuit path comprises a current-limiting circuit coupled to the second terminal of the first circuit path and a second transistor having a gate coupled to the input node, a drain coupled to the first terminal of the first circuit path, and a source coupled to the current-limiting circuit.

4. The level-shifting circuit of claim 3, wherein the current-limiting circuit comprises a resistor coupled between the second terminal of the first circuit path and the source of the second transistor.

5. The level-shifting circuit of claim 3, wherein the current-limiting circuit comprises a current sink coupled between the second terminal of the first circuit path and the source of the second transistor.

6. The level-shifting circuit of claim 3, wherein the second terminal of the first circuit path is coupled to a voltage rail having the second voltage level.

7. The level-shifting circuit of claim 1, further comprising a first transistor, a second transistor, and a third transistor, wherein:

a source of the first transistor and a source of the second transistor are coupled to a first voltage rail having the third voltage level;

a drain of the first transistor is coupled to a gate of the first transistor, to a first terminal of the first circuit path, and to a gate of the second transistor;

a drain of the second transistor is coupled to an output node for outputting the output signal of the level-shifting circuit;

the output node is coupled to a drain of the third transistor; and a source of the third transistor is coupled to a second voltage rail having the fourth voltage level.

8. The level-shifting circuit of claim 1, wherein the second circuit path is configured to temporarily short the first circuit path based on the generated pulse to reduce a settling time of the output signal compared to that of another level shifting circuit without the second circuit path.

9. The level-shifting circuit of claim 1, wherein:

the pulse generator is coupled to a first voltage rail having the first voltage level and to a second voltage rail having the second voltage level; and the generated pulse ranges between the first voltage level and the second voltage level.

10. The level-shifting circuit of claim 1, wherein the second circuit path comprises a first differential pair of transistors having:

gates coupled to a differential output of the pulse generator, wherein at least one of the gates is configured to receive the generated pulse;

drains coupled to differential terminals of the first circuit path; and sources coupled to a terminal of the first circuit path.

11. The level-shifting circuit of claim 10, wherein the first circuit path comprises a current-limiting circuit coupled to the terminal of the first circuit path and a second differential pair of transistors having gates coupled to the input node, drains coupled to the differential terminals of the first circuit path, and sources coupled to the current-limiting circuit.

12. The level-shifting circuit of claim 11, further comprising a first inverter, wherein:

an input of the first inverter is coupled to the input node and to one of the gates of the second differential pair of transistors; and an output of the first inverter is coupled to the other one of the gates of the second differential pair of transistors.

13. The level-shifting circuit of claim 12, further comprising a second inverter, wherein:

an input of the second inverter is coupled to the output of the first inverter; and an output of the second inverter is coupled to an input of the pulse generator.

14. The level-shifting circuit of claim 13, wherein:

at least one of the first inverter or the second inverter is coupled to a first voltage rail having the first voltage level and to a second voltage rail having the second voltage level; and the output of the first inverter and the input of the pulse generator ranges between the first voltage level and the second voltage level.

15. The level-shifting circuit of claim 11, wherein the current-limiting circuit comprises a resistor coupled between the terminal of the first circuit path and the sources of the second differential pair of transistors.

16. The level-shifting circuit of claim 11, wherein the current-limiting circuit comprises a current sink coupled between the terminal of the first circuit path and the sources of the second differential pair of transistors.

17. The level-shifting circuit of claim 11, wherein the terminal of the first circuit path is coupled to a voltage rail having the second voltage level.

18. The level-shifting circuit of claim 1, further comprising a first pair of transistors, a second pair of transistors, and a third pair of transistors, wherein:

sources of the first pair of transistors and sources of the second pair of transistors are coupled to a first voltage rail having the third voltage level;

drains of the first pair of transistors are coupled to respective gates of the first pair of transistors, to respective differential terminals of the first circuit path, and to respective gates of the second pair of transistors;

drains of the second pair of transistors are coupled to respective drains of the third pair of transistors;

a drain of one of the second pair of transistors and a drain of one of the third pair of transistors are coupled to an output node for outputting the output signal of the level-shifting circuit;

gates of the third pair of transistors are coupled together and to a drain of another one of the third pair of transistors; and sources of the third pair of transistors are coupled to a second voltage rail having the fourth voltage level.

19. The level-shifting circuit of claim 1, wherein:
the third voltage level is greater than the first voltage level;
the fourth voltage level is greater than the first voltage level;
the third voltage level is greater than the fourth voltage level; and
the first voltage level is greater than the second voltage level.

20. The level-shifting circuit of claim 1, wherein the fourth voltage level is the same as the second voltage level.

21. The level-shifting circuit of claim 1, wherein the circuit is included in a switching power supply of an envelope tracking power supply.

22. The level-shifting circuit of claim 1, wherein the input node is coupled to an output of a pulse-width modulator.

23. The level-shifting circuit of claim 22, wherein the pulse-width modulator is configured to receive an envelope signal.

24. The level-shifting circuit of claim 23, wherein the output signal is coupled to a driver.

25. The level-shifting circuit of claim 24, wherein the driver is configured to drive a first switch in a switching power supply.

26. The level-shifting circuit of claim 25, further comprising a second level-shifting circuit, wherein an input node of the second level-shifting circuit is coupled to a second output of the pulse-width modulator, an output of the second level-shifting circuit is coupled to a second driver, and the second driver is configured to drive a second switch in the switching power supply.

27. The level-shifting circuit of claim 26, wherein the switching power supply is configured to adjust power supplied to a power amplifier.

28. The level-shifting circuit of claim 27, wherein the power amplifier is configured to amplify a radio frequency signal, the radio frequency signal being based on one or more signals from which the envelope signal is generated.

29. The level-shifting circuit of claim 26, wherein:
the level-shifting circuit and the first driver are each coupled to a supply voltage and a first bias voltage; and
the second level-shifting circuit and the second driver are each coupled to a second bias voltage and ground.

30. The level-shifting circuit of claim 29, wherein the supply voltage comprises a battery voltage, the first bias voltage is between the battery voltage and the second bias voltage, and the second bias voltage is between the first bias voltage and ground.

* * * * *